United States Patent [19]

Veloric

[11] 3,753,774

[45] Aug. 21, 1973

[54] METHOD FOR MAKING AN INTERMETALLIC CONTACT TO A SEMICONDUCTOR DEVICE

[75] Inventor: Harold Seymour Veloric, Morristown, N.J.

[73] Assignee: RCA Corporation, New York, N.Y.

[22] Filed: Apr. 5, 1971

[21] Appl. No.: 131,340

[52] U.S. Cl. .................. 117/212, 117/200, 117/217, 117/45, 117/71, 117/160, 29/630 C, 317/235 UA

[51] Int. Cl. ............................ B44d 1/18, H01g 9/00

[58] Field of Search ............................ 117/212, 200; 29/630 C; 317/235 UA

[56] References Cited

UNITED STATES PATENTS

| | | | |
|---|---|---|---|
| 3,574,008 | 4/1971 | Rice | 117/106 A X |
| 3,558,366 | 1/1971 | Lepselter | 117/212 X |
| 3,632,436 | 1/1972 | Denning | 117/212 |
| 3,615,929 | 10/1971 | Portnoy et al. | 117/212 X |
| 3,604,986 | 9/1971 | Lepselter et al. | 317/235 |
| 3,274,670 | 9/1966 | Lepselter | 117/118 X |

*Primary Examiner*—Alfred L. Leavitt
*Assistant Examiner*—Basil J. Lewris
*Attorney*—G. H. Bruestle, M. Y. Epstein et al.

[57] ABSTRACT

The method includes the step of depositing a semiconductor layer on a surface of a semiconductor body. A metal layer, selected from the metals which will form an intermetallic compound with the semiconductor layer, is deposited on the semiconductor layer and treated to form an intermetallic compound. The treatment step and the thickness of the metal and semiconductor layers is controlled in order to control the depth to which the intermetallic contact extends into the body.

7 Claims, 4 Drawing Figures

INVENTOR.
HAROLD S. VELORIC
BY Herbert L. Allen
ATTORNEY

METHOD FOR MAKING AN INTERMETALLIC CONTACT TO A SEMICONDUCTOR DEVICE

BACKGROUND OF THE INVENTION

The present invention relates to semiconductor devices.

The semiconductor industry presently uses a wide variety of deposited contact layers for making ohmic contact to semiconductor devices. The type of contact layer used is dictated by the reliability, cost, and process requirements of the device.

One of the more reliable, and more costly contact structures that has been developed is commonly referred to as the "beam-lead" contact. In fact, the term "beam-lead" refers to a number of related structures; most of these structures are characterized by a first platinum layer which is deposited in an opening of an insulating coating and on the surface of the semiconductor, e.g., silicon, body. The platinum layer is sintered to form an intermetallic (platinum silicide) region which extends below the surface of the body. Secondary metal layers, such as titanium and gold, are then deposited on the remaining platinum.

As is known, the depth and conductivity of the intermetallic region can be controlled by controlling the thickness of the metal layer and the sintering temperature; thus, by employing a relatively thin metal layer formed at lower temperatures, e.g., between 400°—700°C., the alloy region can be made to extend to relatively shallow depths into the silicon body. But intermetallic contacts formed in this manner have relatively low conductivity.

Further, the intermetallic regions formed at such low temperatures are not as capable of withstanding subsequent high processing temperatures as are the intermetallic regions formed at higher temperatures, e.g., above 700°C.

It is thus desirable to employ techniques which allow a thick, highly conductive intermetallic contact to be formed at relatively high sintering temperatures, but which only extend to a shallow depth below the surface of the semiconductor body.

SUMMARY OF THE INVENTION

The present invention comprises a method for making an intermetallic contact to a semiconductor body having a surface. The method includes the step of depositing an insulating coating on the surface, and providing an opening therein which extends to the surface. Next, a semiconductor layer is deposited in the opening on the surface. A metal layer is then deposited on the semiconductor layer; this metal is one of the metals that, when treated, will form an intermetallic compound with the semiconductor layer. Thereafter, the metal and semiconductor layers are treated to form an intermetallic compound of the metal and the semiconductor layer.

THE DRAWING

DETAILED DESCRIPTION

Figures 1, 2, 3, 4:
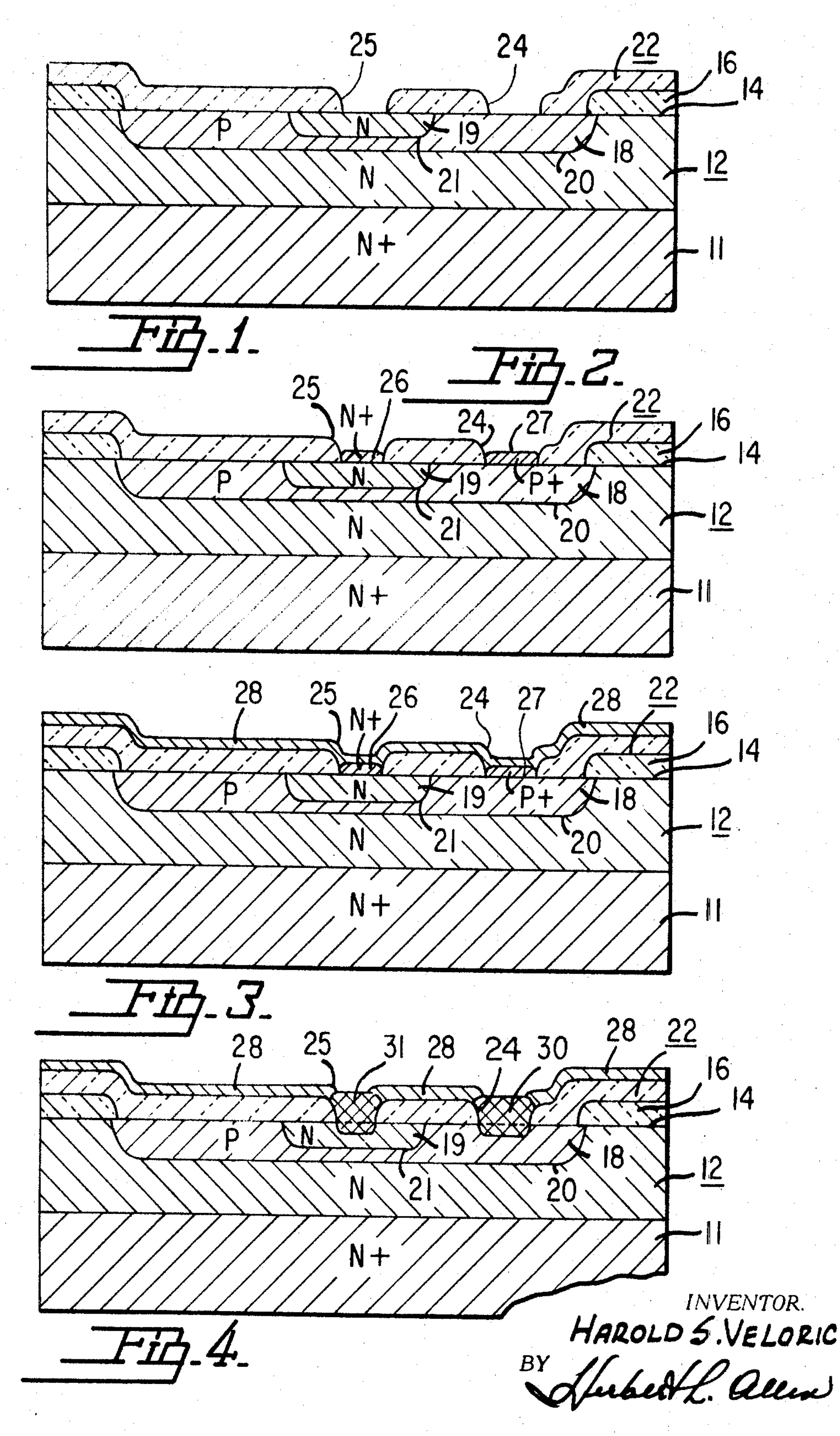
FIG. 1 is a cross-section of a device during an intermediate step in the method of the present invention, in which several known steps have already preceded the illustrated step.
FIGS. 2–4 are cross-sections illustrating further steps in the method of the present invention subsequent to the step shown in FIG. 1.

The method will now be described in detail with reference to FIGS. 1–4, which illustrate the application of the present invention in the fabrication of a bipolar transistor. It will be understood, however, that the method is not limited to such devices and may also be employed in the fabrication of didoes, thyristors, integrated circuits, and other varieties of semiconductor devices.

Several known steps have preceded the step illustrated in FIG. 1. As shown in FIG. 1, thses earlier steps result in a highly conductive collector substrate 11 of one conductivity type (N+ in this example), with a more resistive epitaxial collector region 12 of like (N) conductivity type thereon. A diffused base region 18 of a second (P) conductivity type extends into the collector 12 from its upper surface 14 and forms a base-collector PN junction 20 therebetween. An emitter region 19 of the first (N) conductivity type extends into the base region 18 and forms an emitter-base PN junction 21 therebetween.

Preferably, the collector substrate 11 and the collector, base, and emitter regions 12, 18, and 19 comprise silicon; their dimensions are not critical.

Still referring to FIG. 1, portions of an initial insulating coating 16, e.g., silicon dioxide, remain over the collector region at the surface 14. After the earlier base and emitter diffusion steps, another insulating coating 22 is left deposited on the surface 14 over the base and emitter regions 18 and 19 and over the remaining portions of the initial insulating coating 16. In practice, the insulating coatings 16 and 22 are very thin, on the order of between 10,000 and 20,000 A thick. But to more clearly illustrate the present invention, the thickness of the insulating coatings 16 and 22 and other deposited layers described below are greatly exaggerated.

As shown in FIG. 1, the insulating coating 22 is treated to open base and emitter contact openings 24 and 25 therein and expose portions of the base and emitter regions 18 and 19, respectively, at the surface 14. For example, this treating step may be accomplished by a standard photolithographic sequence in which the insulating coating 22 is coated with a photoresist, masked with a pattern containing the contact openings 24 and 25, and exposed and developed. The coating 22 is then treated with an etchant which removes only that portion of the coating 22 in the openings 24 and 25.

Referring now to FIG. 2, layers 26 and 27 of semiconductor material are deposited only in the openings 24 and 25, respectively. Each layer 26 and 27 is the same conductivity as the region 19 and 18, respectively, to which it contacts, and preferably, is very highly conductive. Thus, in this example, the layer 26 is of N+ conductivity and the layer 27 is of P+ conductivity. Suitably, the semiconductor layers 26 and 27 are monocrystalline, although polycrystalline semiconductor material may also be used. Further, the semiconductor layers 26 and 27 need not be the same semiconductor material as that of the collector substrate 11 and the regions 12, 18, and 19, but preferably it is so. For example, if the substrate 11 and region 12 comprise silicon, as in this example, the semiconductor layers 26 and 27 also preferably comprise silicon. The thickness of the semiconductor layers 26 and 27 are not critical. However, as will be more fully described below, the thickness of the semiconductor layers 26 and 27 determines, in part, the alloying depth below the surface 14 of the intermetallic contact which is subsequently formed. By way of example, the semiconductor layers 26 and 27 may be about 5,000 A thick. These layers 26 and 27 may be deposited in the openings 24 and 25 by any one of a variety of known techniques which do not constitute a part of this invention. For instance, the semiconductor layers 26 and 27 may be deposited by the hydrogen reduction of silicon tetrachloride.

Noting FIG. 3, a metal layer 28 is deposited over the insulating coating 22 and the semiconductor layers 26 and 27 in each opening 24 and 25 by known techniques, such as evaporation or sputtering. It is essential that the metal of the layer 28 is one of the metals that, when treated, will form an intermetallic compound with the material of the semiconductor layers 26 and 27. Suitable metals include gold, silver, platinum, palladium, and rhodium; however, because the intermetallic characteristics of platinum and silicon are relatively well known, platinum is preferred.

The thickness of the metal layer 28 is also not critical; again, however, the thickness of the layer 28 also determines, in part, the alloying depth below the surface 14 of the intermetallic contact. By way of illustration, the metal layer 28 may be about 8,000 A thick.

Thereafter, the semiconductor and metal layers 26, 27, and 28 are treated to form an intermetallic compound which defines an intermetallic base contact 30 only in the base opening 24, and an intermetallic emitter contact 31 only in the emitter opening 25. The contacts 30 and 31 may be formed by sintering the semiconductor and metal layers 26, 27, and 28 to a temperature between 400° and 900°C. in an inert atmosphere (as argon).

When the metal layer 28 comprises platinum and the semiconductor layers 26 and 27 comprises silicon, as in this embodiment, intermetallic contacts 30 and 31 of platinum silicide are formed in the openings 24 and 25 by sintering the layers 26, 27, and 28 to a temperature of about 750°C. When the thickness of the layers 26, 27, and 28 have been properly adjusted, the platinum silicide intermetallic contacts 30 and 31 will extend to a shallow depth into the base and emitter regions 18 and 19, respectively, as is shown in FIG. 4. By way of example, when the platinum and silicon layers are 3,000 and 3,000 A thick, respectively, and a sintering temperature above 750°C. is used, the platinum silicide contacts 30 and 31 will extend about 1,200 A into the base and emitter regions 18 and 19.

After formation of the intermetallic contact 30 and 31, the remaining platinum 28 may be removed, and metallic emitter and base contact layers are deposited in ohmic contact with the intermetallic contacts 30 and 31.

The method of the present invention offers an important advantage with respect to the prior art, in that an intermetallic contact to a semiconductor device can be formed independent of alloying depth considerations.

I claim:

1. A method for making an intermetallic ohmic contact to a semiconductor body comprising the steps of:

a. providing a semiconductor body having a surface with an insulating coating thereon, said coating having an opening which extends to said surface;
b. depositing a semiconductor layer in said opening and on said surface;
c. depositing a metal layer on said semiconductor layer which, when treated, will form an intermetallic compound with said semiconductor layer and said semiconductor body; and
d. treating said metal layer, semiconductor layer, and semiconductor body to form an intermetallic compound which extends through said semiconductor layer and into said semiconductor body.

2. A method according to claim 1, wherein said semiconductor layer is monocrystalline.

3. A method according to claim 2, wherein said semiconductor layer is of the same conductivity type as said semiconductor body.

4. A method according to claim 1, wherein said semiconductor body and semiconductor layer comprise a like semiconductor material.

5. A method according to claim 4, wherein said semiconductor material comprises silicon.

6. A method according to claim 5, wherein said metal layer is selected from a group consisting of gold, silver, platinum, palladium, and rhodium.

7. A method for making an intermetallic ohmic contact to a semiconductor body, comprising the steps of:

a. providing a silicon body having a surface with an insulating coating thereon, said coating having an opening extending to said surface;
b. depositing a monocrystalline silicon layer in said opening and on said surface;
c. depositing a platinum layer on said silicon layer; and
d. heating said layers in an inert atmosphere to a temperature in excess of 750°C. to form a platinum silicide contact which extends through said silicon layer to a shallow depth below said surface into said body.

* * * * *